United States Patent
Grimaldi et al.

(10) Patent No.: US 9,673,298 B2
(45) Date of Patent: Jun. 6, 2017

(54) INTEGRATED VERTICAL TRENCH MOS TRANSISTOR

(71) Applicant: STMicroelectronics S.R.L., Agrate Brianza (IT)

(72) Inventors: Antonio Giuseppe Grimaldi, S. Giovanni La Punta (IT); Davide Giuseppe Patti, Mascalucia (IT); Monica Miccichè, Enna (IT); Salvatore Liotta, Aci S. Antonio (IT); Angela Longhitano, Belpasso (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/949,528

(22) Filed: Nov. 23, 2015

(65) Prior Publication Data
US 2016/0087080 A1    Mar. 24, 2016

Related U.S. Application Data

(62) Division of application No. 14/028,364, filed on Sep. 16, 2013.

(30) Foreign Application Priority Data

Sep. 25, 2012  (IT) .............................. MI2012A1599

(51) Int. Cl.
*H01L 21/8234*    (2006.01)
*H01L 29/66*    (2006.01)
(Continued)

(52) U.S. Cl.
CPC .... *H01L 29/66666* (2013.01); *H01L 27/0629* (2013.01); *H01L 29/4236* (2013.01);
(Continued)

(58) Field of Classification Search
CPC ............. H01L 29/4236; H01L 29/7813; H01L 29/66734; H01L 29/66621
See application file for complete search history.

(56) References Cited

U.S. PATENT DOCUMENTS 4,760,434 A     7/1988  Tsuzuki et al.
4,896,196 A *   1/1990  Blanchard ........... H01L 29/1095
                                                      257/139

(Continued)

FOREIGN PATENT DOCUMENTS

JP    2007-266483 A    10/2007
JP    2008-98554 A     4/2008
JP    2009-38208 A     2/2009

*Primary Examiner* — Jesse Y Miyoshi
(74) *Attorney, Agent, or Firm* — Seed IP Law Group LLP

(57) ABSTRACT

A VTMOS transistor in semiconductor material of a first type of conductivity includes a body region of a second type of conductivity and a source region of the first type of conductivity. A gate region extends into the main surface through the body region and is insulated from the semiconductor material. A region of the gate region extends onto the main surface is insulated from the rest of the gate region. An anode region of the first type of conductivity is formed into said insulated region, and a cathode region of the second type of conductivity is formed into said insulated region in contact with the anode region; the anode region and the cathode region define a thermal diode electrically insulated from the chip.

20 Claims, 5 Drawing Sheets

(51) Int. Cl.
*H01L 29/78* (2006.01)
*H01L 27/06* (2006.01)
*H01L 29/861* (2006.01)
*H01L 29/423* (2006.01)

(52) U.S. Cl.
CPC .... *H01L 29/6609* (2013.01); *H01L 29/66734* (2013.01); *H01L 29/7804* (2013.01); *H01L 29/7813* (2013.01); *H01L 29/861* (2013.01); *H01L 29/42376* (2013.01)

(56) References Cited

U.S. PATENT DOCUMENTS

| | | | |
|---|---|---|---|
| 6,303,410 | B1 | 10/2001 | Baliga |
| 6,312,993 | B1 * | 11/2001 | Hshieh ............... H01L 29/7813 257/327 |
| 6,323,518 | B1 | 11/2001 | Sakamoto et al. |
| 6,638,850 | B1 | 10/2003 | Inagawa et al. |
| 6,835,615 | B2 | 12/2004 | Ohtomo |
| 7,443,225 | B2 * | 10/2008 | Lui ..................... H01L 27/0255 327/325 |
| 7,462,922 | B2 | 12/2008 | Mori et al. |
| 7,943,439 | B2 | 5/2011 | Yoshikawa |
| 8,183,606 | B2 | 5/2012 | Arai et al. |
| 8,349,666 | B1 * | 1/2013 | Leal ..................... H01L 23/585 257/E21.59 |
| 2004/0041207 | A1 * | 3/2004 | Takano ............... H01L 29/7813 257/330 |
| 2006/0261391 | A1 | 11/2006 | Nakazawa et al. |
| 2008/0290367 | A1 | 11/2008 | Su et al. |
| 2009/0283776 | A1 | 11/2009 | Iwamuro |
| 2012/0049187 | A1 | 3/2012 | Haruyama et al. |

* cited by examiner

INTEGRATED VERTICAL TRENCH MOS TRANSISTOR

BACKGROUND

Technical Field

The present disclosure generally relates to the field of semiconductor devices. More particularly, the present disclosure relates to vertical gate MOS field effect transistors (or VTMOS, "Vertical Trench-MOS").

Description of the Related Art

A VTMOS transistor integrated on a chip of the semiconductor material comprises a drain region at a rear surface of the chip, a source region at a front surface of the chip opposite the rear surface, and a gate region in a trench extending in the chip from the front surface. More particularly, the walls of the trench are coated with a layer of insulating material (typically, gate oxide), and the trench is filled with a conductive material (typically, polycrystalline silicon or polysilicon).

During operation, a channel region is created along the walls of the trench, between the source region and the drain region. In this way, in the case of a small size of the VTMOS transistor (for example, for making electronic circuits having high integration density), the channel region may be maintained sufficiently long to prevent short channel effects (for example, punch-through or permanently shorted channel) and unwanted changes in characteristic electrical parameters (for example, transconductance).

Although widely used, the VTMOS transistors have drawbacks that preclude a wider deployment thereof, for example, in power applications.

In such applications, the VTMOS transistors, being affected by relatively high voltages and/or currents (for example, 1-500 A and 10-100V), are subject to considerable heating; an excessive and/or prolonged heating (or overheating) may cause damages or breakages of the VTMOS transistor even after relatively short periods of use.

In order to avoid that, different solutions are based on the common approach of monitoring the current through the VTMOS transistor, and turn it off when it exceeds a predefined value (associated with an overheating condition). However, such approach involves operation errors, such as false detections of overheating conditions. This is due to the fact that the current monitoring does not allow distinguishing between short-circuit current—which, lasting for typically long times, determines the overheating of the transistor—and switching current—which, limited to a short time interval corresponding to a switching, does not instead determine an appreciable overheating. Furthermore, in the case where the short-circuit current is lower than the predefined value, but lasting for a time sufficiently long to overheat the transistor, the overheating condition is not detected.

A different approach provides for detecting the temperature of the transistor. In a typical implementation, two conductive regions having opposite doping are integrated onto the chip together with the VTMOS transistor to form a corresponding thermal diode; in this way, by exploiting the (inverse) proportionality between the voltage drop across a forward-biased diode and its junction temperature, it is possible to detect the overheating condition in an appropriate manner.

However, the solutions based on such approach are not satisfactory in terms of electrical performance. In fact, as the thermal diode is typically buried within the chip, it affects the current through the VTMOS transistor. In addition, unavoidable couplings between the conductive regions of the diode and the conductive regions of the VTMOS transistor adjacent thereto may determine parasitism (for example, parasitic diodes and/or BJT transistors) able to modify the functioning of the VTMOS transistor and of the thermal diode.

In addition, the presence of the trench reduces the available space on the chip where to make the thermal diode; this makes the establishment of couplings between the conductive regions of the thermal diode and the conductive regions of the VTMOS transistor even more likely (which requires more effort design).

BRIEF SUMMARY

In its general terms, the solution according to one or more embodiments of the present disclosure is based on making the thermal diode in an insulated region of the gate region of the VTMOS transistor.

More specifically, an aspect of the solution according to an embodiment of the present disclosure relates to a method for integrating an electronic device (comprising a VTMOS transistor) onto a chip. A gate structure is formed so as to extend into the chip and onto its main surface; a region of the gate structure that extends on the main surface is insulated from the rest of the gate structure (wherein the gate region is formed), and an anode region and a cathode region in contact with each other are formed into said insulated region to define a thermal diode electrically insulated from the chip.

Another aspect of the solution according to an embodiment of the disclosure relates to an electronic device obtained by such method.

A further aspect of the solution according to an embodiment of the disclosure relates to a system comprising one or more of such electronic devices.

BRIEF DESCRIPTION OF THE SEVERAL VIEWS OF THE DRAWINGS

A solution according to one or more embodiments of the disclosure, as well as further features and the advantages thereof, will be best understood with reference to the following detailed description, given purely by way of a non-restrictive indication, to be read in conjunction with the accompanying drawings (wherein, for the sake of ease, corresponding elements are denoted with equal or similar references, and their explanation is not repeated for the sake of brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
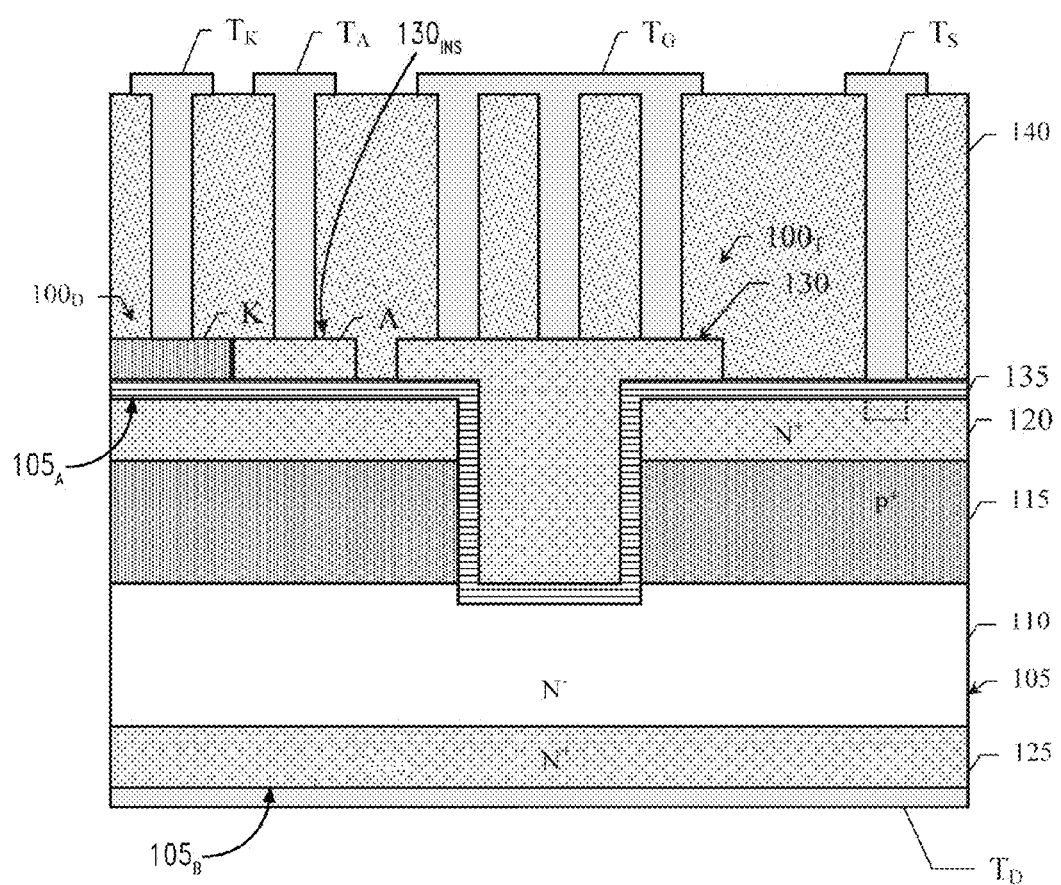
FIG. 1 schematically shows a sectional view of an electronic device according to an embodiment of the present disclosure.

With particular reference to FIG. 1, it schematically shows a sectional view of an electronic device 100 (comprising a vertical gate MOS transistor—VTMOS, "Vertical Trench-MOS"-, or transistor $100_T$, and a thermal diode $100_D$) according to an embodiment of the present disclosure.

In the following, the concentrations of N-type and P-type dopants (or impurities) are denoted by adding the sign + or the sign − to the letters N and P to indicate a high or low concentration of impurities, respectively, or the sign ++ or the sign −− to indicate a very high or a very low concentration of impurities, respectively; the letters N and P without the addition of any sign denote intermediate concentrations.

The electronic device 100 is integrated on a chip 105 of semiconductor material of N$^+$-type (for example, phosphorus-doped silicon), which has a front surface $105_A$ and a rear surface $105_B$ opposite the front surface $105_A$.

The transistor $100_T$ comprises a drift region 110 of N$^-$-type that extends into the chip 105 from the front surface $105_A$, a body region 115 of P$^+$-type (for example, boron-doped silicon) that extends into the drift region 110 from the front surface $105_A$, and a source region 120 of N$^+$-type that extends into the body region 115 from the front surface $105_A$—with such chip 105 that defines, between the drift region 110 and the rear surface $105_B$, a corresponding drain region 125.

The transistor $100_T$ further comprises a gate region 130 of conductive material (for example, polysilicon with N$^+$-type doping), which extends vertically into the drift region 110 from the front surface $105_A$ (through the body region 115 and the source region 120) and it is electrically insulated from the chip 105 (by means of an insulating layer 135).

As visible in the figure, the gate region 130 protrudes in height beyond the front surface $105_A$, and extends also onto at least part of it. Furthermore, a region $130_{INS}$ separated from the gate region 130 and insulated from the chip 105 (through the same insulating layer 135) is provided on the front surface $105_A$, inside which an N$^+$-type conductive region and a P$^+$-type conductive region in contact with each other define an anode region A and a cathode region K, respectively, of the thermal diode $100_D$.

Compared to the known solutions, where the thermal diode is electrically connected to the chip, in the solution according to an embodiment of the present disclosure the thermal diode $100_D$ is integrated on the chip 105 but completely insulated from it (i.e., floating). In this way, the thermal diode $100_D$ may be used to adequately detect overheating conditions of the transistor $100_T$, without inducing parasitism within the chip 105 and without affecting the current through the transistor $100_T$.

The electronic device 100 further comprises a dielectric region 140, which extends on the cathode region K, the anode region A, the gate region 130 and exposed portions of the dielectric layer 135 to provide electrical insulation and mechanical protection to the chip 105, and terminals for accessing the conductive regions.

More particularly, the electronic device 100 comprises a source terminal $T_S$, a gate terminal $T_G$, a cathode terminal $T_K$ and an anode terminal $T_A$ exposed on a top surface of the dielectric region 140, and a drain terminal $T_D$ on the rear surface $105_B$ of the chip 105. The terminals $T_S, T_G, T_K, T_A$ are connected, by means of corresponding via-holes through the dielectric region 140, to the source region 120, the gate region 130, the cathode region K and the anode region A, respectively (with the terminal $T_S$ in a rearward position with respect to the terminal $T_G$—as conceptually represented in the figure by dotted lines of the corresponding via-hole—so as not to contact the gate region 130), whereas the terminal $T_D$ is directly connected to the drain region 125.

Turning to FIGS. 2A-2F, they schematically show some significant steps of the production process of the electronic device 100 according to an embodiment of the present disclosure.

As it is known, the production process is performed at the level of a batch of completely identical electronic devices 100, which are concurrently made in large numbers onto a wafer of semiconductor material and separated at the end through a cutting operation (for the sake of description ease, however, reference to only one of such electronic devices will be made in the following).

Figure 2A:
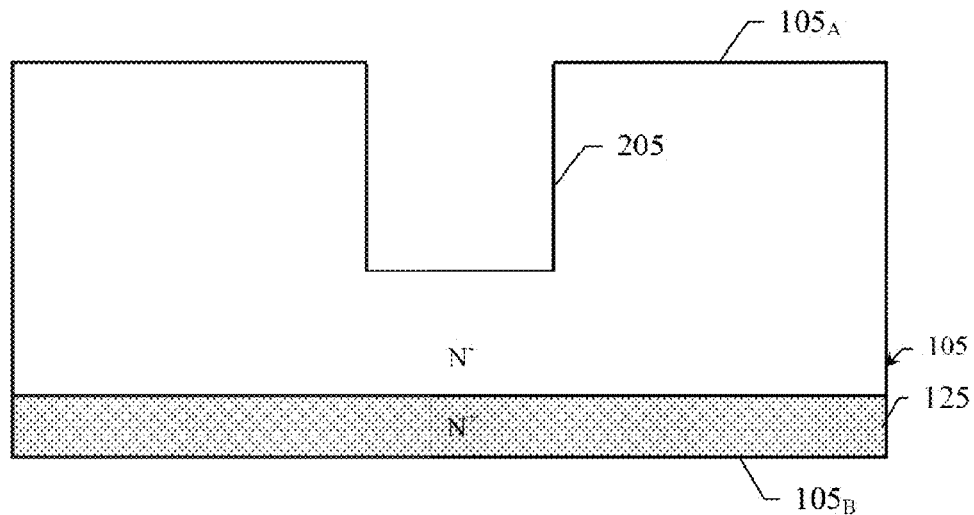
FIGS. 2A-2F schematically show some significant steps of the production process of such electronic device according to an embodiment of the present disclosure, and FIG. 3 schematically shows an electronic system according to an embodiment of the present disclosure.

Considering in particular FIG. 2A, the production process starts with the making of a trench 205 (for example, having a U-shaped section) extending into the chip 105 from the front surface $105_A$. As visible in the figure, at this stage the chip 105 has mainly a N$^-$-type doping (for example, obtained in a known manner before the making of the trench 205) and it only comprises the drain region 125 (however, in an alternative embodiment discussed below, at this stage the chip 105 may also comprise the drift region 110, the body region 115 and/or the source region 120).

Figure 2B:
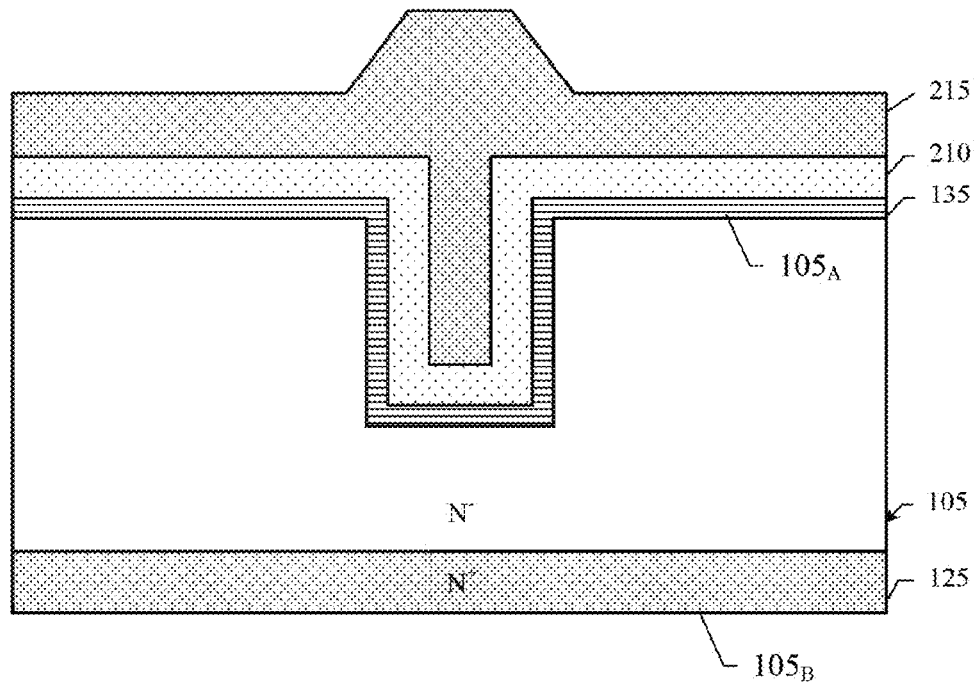

Turning now to FIG. 2B, the insulating layer 135 (e.g., silicon oxide) is formed onto the front surface $105_A$ and onto a boundary surface of the trench 205 (i.e., onto—side and end—exposed walls thereof), a conductive layer 210 (for example, of un-doped polysilicon) is deposited onto the insulating layer 135, and a further conductive layer 215 (for example, of N$^+$-doped polysilicon) is deposited onto the conductive layer 210 (so as to fill the trench 205). The layers 135, 210, 215 do not completely cover the front surface $105_A$ (as exposed portions of the front surface $105_A$ are used for other purposes, for example, for subsequent contact of the source region); therefore such layers 135, 210, 215 are formed by selective processes, or by non-selective processes followed by selective etching.

Figure 2C:
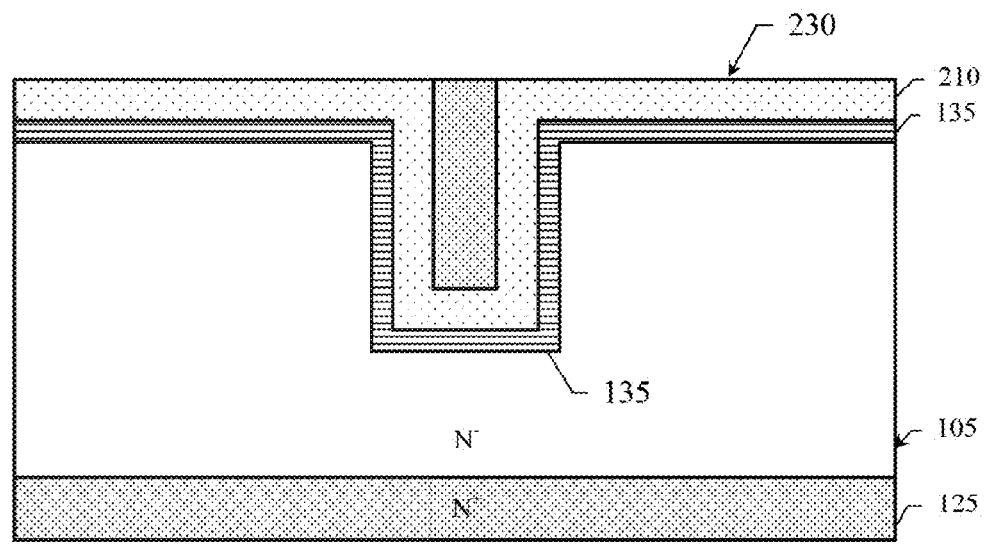

As shown in FIG. 2C, the workpiece thereby obtained is subject to a surface planarization treatment (for example, a chemical-mechanical polishing) for removing the conductive layer 215 outside the trench 205. In this way a gate structure 230 is obtained that comprises the insulating layer 135, exposed portions of the conductive layer 210 on the front surface $105_A$, and portions of the conductive layers 210, 215 within the trench 205—as will be explained shortly, both the thermal diode and the gate region of the transistor will be made from such gate structure 230.

Figure 2D:
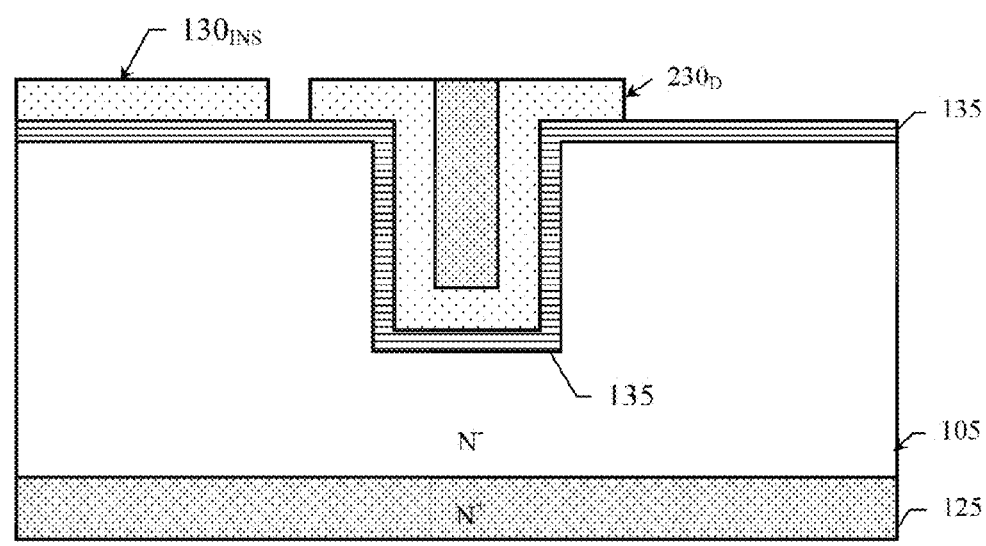

Then, a photo-resist mask, not shown in the figure, is formed onto the gate structure 230 by means of a photo-lithographic technique; portions of the gate structure 230 being not protected by the mask are etched—for example, through a dry etching operation. The result of such operation is shown in FIG. 2D, with the making of the insulated region $130_{INS}$ and of a conductive region $230_D$ (that will form the gate region 130)—anyway, although advantageous in terms of construction symmetry, the making of the conductive region $230_D$ may be omitted, in which case the gate region 130 may be defined from the gate structure 230 without the insulated region $130_{INS}$.

Figure 2E:
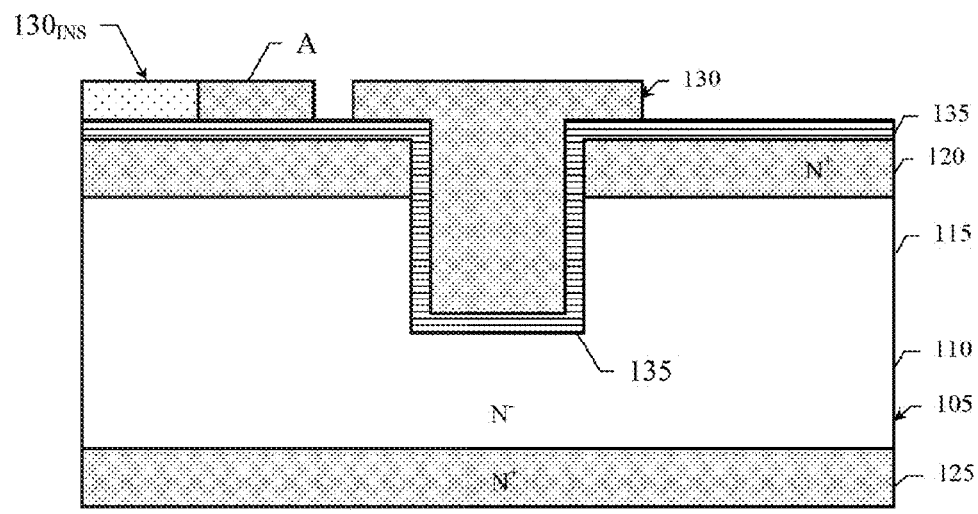

At this point, as shown in FIG. 2E, a single ion implantation process of N$^+$ type dopant is carried out into a part of the insulated region $130_{INS}$ so as to define the anode region A, into the rest of the gate structure (i.e., in the conductive region $230_D$ in the example at issue) so as to define the gate region 130 (with uniform doping), and into the chip 105 so as to define the source region 120. This is achieved by defining (by means of suitable masks, not shown) the implantation areas, and performing an ion bombardment with controlled dopant diffusion (for example, by controlling implantation energies and time). It should be noted that, although not visible in the figure (because of the used viewpoint), the source region 120 will be provided with N$^-$-doped zones (instead of N$^+$ ones) at (i.e., below) the regions A,K and at portions of the gate region 130 laterally protruding from the trench—because of the "masking" induced by them. Anyway, such N$^-$-doped zones, having negligible size (compared to the source region 120), do not involve changes of the electrical characteristics of the electronic device 100.

Figure 2F:
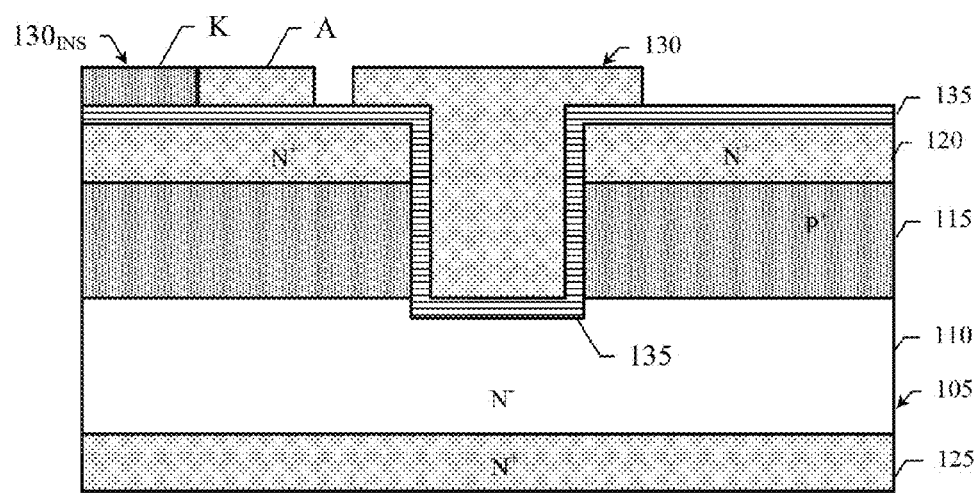

Then, as shown in FIG. 2F, a single process of ion implantation of P$^+$-type dopant (analogous to the previous one) is carried out into another part of the insulated region 130$_{INS}$ so as to define the cathode region K, and into the chip 105 so as to define the body region 115 (and hence the drift region 110 interposed between it and the drain region 125). As before, the body region 115 will be provided with N$^+$-doped zones (instead of P$^+$ ones) below the regions A, K and the portions of the gate region 130 laterally protruding from the trench. In any case, similarly to what has been discussed above, such N$^+$-doped zones, having negligible size (compared to the body region 115), do not involve changes of the electrical characteristics of the electronic device 100.

At this point, the production process ends, in a known manner, with the deposition of the dielectric region 140 and with the making of the terminals T$_S$,T$_G$,T$_K$,T$_A$,T$_D$, as shown in FIG. 1.

The described solution is advantageous as it allows making the thermal diode 100$_D$ contextually to the source region 120, the body region 115 and the gate region 130; this allows obtaining a simple and efficient production process, which does not require additional mask levels nor dedicated diffusion or implantation layers (with corresponding cost reduction).

Figure 3:
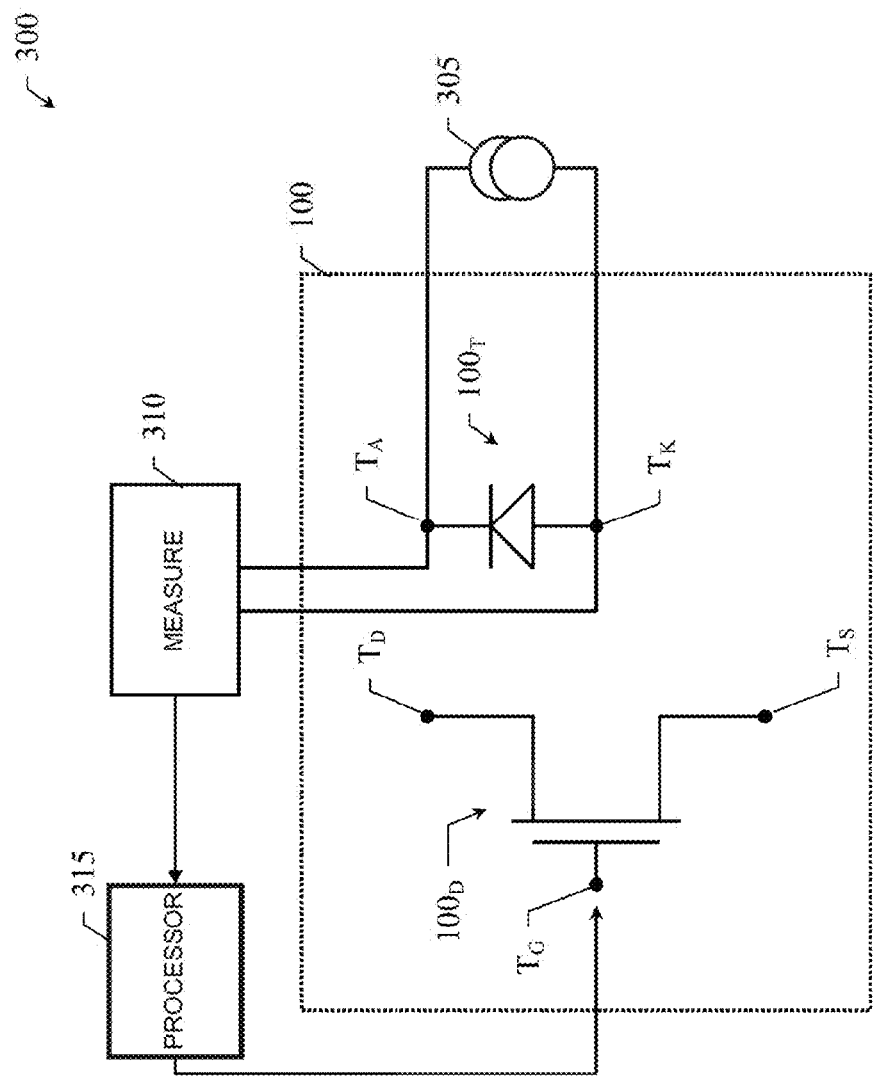

With reference now to FIG. 3, it schematically shows an electronic system 300 according to an embodiment of the present disclosure.

The electronic system 300 comprises the electronic device 100 (or more of them), shown in the figure by circuit representation of the transistor 100$_T$ and of the corresponding thermal diode 100$_D$ electrically insulated from it.

The electronic system 300 further comprises a biasing element 305 (e.g., a bias current generator, indicated in the figure by means of its circuit symbol), connected between the terminals T$_K$ and T$_A$ to provide a bias current to the thermal diode 100$_D$, and a measuring circuit 310, also connected between the terminals T$_K$ and T$_A$, for measuring a voltage across the thermal diode 100$_D$.

The electronic system 300 further comprises a processing circuit 315 for determining an operating temperature of the transistor 100$_T$ according to the corresponding measured voltage (according to the inverse proportionality relationship between the voltage across a forward-biased diode and its junction temperature—in the specific case, in turn determined by the operating temperature of the transistor 100$_T$). In the described embodiment, the processing circuit 315 is also connected to the gate terminal T$_G$ for controlling the operation of the transistor 100$_T$ according to the determined operating temperature.

Such solution is advantageous as, through the thermal diode 100, it is possible to determine the operating temperature of the transistor 100$_T$ without affecting the current through it.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment of the present disclosure proposes a method for integrating an electronic device comprising a VTMOS transistor onto a chip of semiconductor material of a first type of conductivity. The method comprises the following steps. A body region of a second type of conductivity extending into the chip from a main surface of the chip is formed. A source region of the first type of conductivity extending into the body region from the main surface is formed. A gate region of conductive material extending into the chip from the main surface is formed through the body region; the gate region is insulated from the chip. In the solution according to one or more embodiments of the present disclosure, the step of forming a gate region comprises forming a gate structure extending into the chip from the main surface through the body region and onto the main surface. The method further comprises the following steps. A region of the gate structure extending on the main surface is insulated from the rest of the gate structure; the gate region is obtained from said rest of the gate structure. An anode region of the first type of conductivity is formed into said insulated region, and a cathode region of the second type of conductivity is formed into said insulated region in contact with the anode region; the anode region and the cathode region define a thermal diode electrically insulated from the chip.

Anyway, although in the present description explicit reference has been made to a chip integrating a single VTMOS transistor and a single thermal diode, this should not to be understood in a limitative way. In general, number and type of electronic components integrated onto the chip may be any; for example, it is possible to envisage the use of a greater number of thermal diodes associated with the same transistor (in which case, it may be necessary to form a higher number of insulated regions in the same chip). Furthermore, similar considerations apply if the N-type regions are replaced by P-type regions, and vice-versa, or if the various regions have different impurities concentrations (for example, N$^{++}$, P$^{++}$ or N$^{--}$, P$^{--}$ dopings); moreover, the conductive regions of the transistor may have any shape, size, position and number.

According to an embodiment of the present disclosure, the step of forming a gate structure comprises the following steps. A trench extending into the chip from the main surface is formed through the body region. An insulating layer is formed onto the main surface and onto a boundary surface of the trench. A first conductive layer is formed onto the insulating layer. A second conductive layer is formed onto the first conductive layer so as to fill the trench. The second conductive layer is removed outside the trench so as to expose the first conductive layer on the main surface thereby defining the gate structure.

Although in the description reference has been made to a "U"-shaped trench, this does not prevent from making it with any other suitable shape. In addition, the trench may extend into the chip without reaching the drift region (for example, by extending not beyond the body region). The insulating layer may comprise, as previously described, silicon oxide—so that it may be formed by a known growth process. Alternatively, the insulating layer may comprise any other material with appropriate dielectric properties obtained by any suitable deposition technique (for example, chemical vapor deposition). Moreover, the making of the gate structure by a single layer of conductive material is not excluded.

According to an embodiment of the present disclosure, the first conductive layer comprises un-doped polysilicon, and the second conductive layer comprises doped polysilicon.

Anyway, the first conductive layer and the second conductive layer may comprise any material. For example, they may be both of un-doped polysilicon (in this way, the following dopant implantation would allow obtaining a gate region with highly uniform doping).

According to an embodiment of the present disclosure, the step of removing the second conductive layer outside the trench comprises performing a chemical-mechanical polishing.

Anyway, such step may also be omitted in a basic implementation (for example, in case of controlled deposition of the second conductive layer only into the trench), or it may be implemented by any other ablation technique.

According to an embodiment of the present disclosure, the step of insulating a region of the gate structure comprises removing a portion of the first conductive layer.

Anyway, such step may be omitted as well (for example, in case of implementation of the insulation by means of interposition of an insulating structure, or in case the insulated region is formed—for example, thanks to the use of selective techniques—already separated from the rest of the gate structure).

According to an embodiment of the present disclosure, the step of forming an anode region comprises performing a first ion implantation of dopant of the first type of conductivity into a first part of the first conductive layer defining said insulated region, and the step of forming a cathode region comprises performing a second ion implantation of dopant of the second type of conductivity into a second part of the first conductive layer defining said insulated region.

Such ion implantations may be made in succession (as exemplarily described above), or in any other order.

According to an embodiment of the present disclosure, the step of forming a gate region comprises performing said first ion implantation of dopant of the first type of conductivity further into at least part of the rest of the gate structure, and the step of forming a body region comprises performing said second ion implantation of dopant of the second type of conductivity further into the chip.

As before, such ion implantations may be performed in succession (as exemplarily described above), or in any other order. Furthermore, the ion implantation of dopant for obtaining the gate region may be performed onto all the rest of the gate structure (for example, for obtaining a gate region that extends laterally far beyond the trench). Anyway, the making of the source region and/or of the body region independently of the making of the thermal diode is not excluded; in this respect, in an alternative embodiment, not shown, the starting structure for implementing the described solution may comprise the chip with the drain region, the drift region, the body region and the source region being already formed.

In general, the solution according to an embodiment of the disclosure lends itself to be implemented through an equivalent method (by using similar steps, removing some non-essential steps, or adding additional optional steps); moreover, the steps may be performed in a different order, in parallel or overlapped (at least in part).

An embodiment of the present disclosure proposes an electronic device comprising a VTMOS transistor integrated on a chip of semiconductor material of a first type of conductivity. The electronic device comprises a body region of a second type of conductivity extending in the chip from a main surface of the chip, a source region of the first type of conductivity extending in the body region from the main surface, and a gate region of conductive material extending in the chip from the main surface through the body region; the gate region is insulated from the chip. In the solution according to one or more embodiments of the present disclosure, the electronic device comprises a region insulated from the gate region and from the chip on the main surface of the chip, an anode region of the first type of conductivity in said insulated region, and a cathode region of the second type of conductivity in said insulated region in contact with the anode region. The anode region and the cathode region define a thermal diode electrically insulated from the chip.

Anyway, similar considerations apply if the electronic device has a different structure or comprises equivalent components. In any case, any of its components may be separated into several elements, or two or more components may be combined into a single element; in addition, each component may be replicated to support the execution of the corresponding operations in parallel. It should also be noted that (unless stated otherwise) any interaction between different components generally does not need be continuous, and it may be direct or indirect via one or more intermediaries.

For example, the number of via-holes is not limitative, and it does not necessarily coincide with the number of terminals of the chip. Furthermore, the number of terminals is not limitative. Each terminal may have one or more pads, and each pad may be associated with multiple via-holes. In addition, the size and distribution of the terminals may be chosen according to electrical and mechanical considerations. In this respect, the source terminal may be formed next to the gate terminal (for example, after removal of a part of the conductive layer above the source region).

It should be understood that the design of the electronic device may also be created in a programming language; in addition, if the designer does not manufacture the corresponding integrated devices or masks, the design may be transmitted by physical means to others. In any case, the resulting integrated circuit may be distributed by its manufacturer in raw wafer form, as a bare die, or in packages. Moreover, the proposed structure may be integrated with other circuits on the same chip, or it may be mounted in intermediate products (such as mother boards) and coupled with one or more other chips (such as a processor).

An embodiment of the present disclosure proposes a system comprising at least one electronic device. The system further comprises means for biasing the thermal diode of each electronic device, means for measuring an electrical quantity of the thermal diode of each electronic device, and means for determining an operating temperature of each VTMOS transistor according to the corresponding measured electrical quantity.

However, the electronic device may be used in any other application, and may obviously be made and marketed as a stand-alone product as well.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming an electronic device having a vertical trench MOS transistor in a semiconductor substrate, wherein the forming of the electronic device includes:
   forming a body region extending into the semiconductor substrate from a first surface of the semiconductor substrate;
   forming a source region extending into the body region from the first surface;
   forming an insulating layer overlying the first surface;
   forming an un-doped conductive layer extending into the semiconductor substrate from the first surface through the body region, the un-doped conductive layer being insulated from the semiconductor substrate by the insulating layer;
   forming a doped conductive layer extending into the semiconductor substrate from the first surface through the body region, the doped conductive layer being separated from the insulating layer by the un-doped conductive layer;
   forming a first conductive region and a second conductive region from the un-doped conductive layer, the first conductive region being physically separated from the second conductive region; and
   forming a gate region by doping the second conductive region to have the same type of conductivity as the doped conductive layer;
   forming a thermal diode adjacent to the gate region, the thermal diode and the gate region being positioned on the insulating layer, the thermal diode being electrically insulated from the semiconductor substrate by the insulating layer, wherein the forming of the thermal diode includes:
      forming an anode region with a first portion of the first conductive region; and
      forming a cathode region with a second portion of the first conductive region.

2. The method according to claim 1 wherein the forming of the first conductive region and the second conductive region includes:
removing a portion of the un-doped conductive layer extending on the first surface, the portion of the un-doped conductive layer being disposed between the first conductive region and the second conductive region.

3. The method according to claim 1, wherein
the semiconductor substrate is of a first type of conductivity,
the body region is of a second type of conductivity,
the source region is of the first type of conductivity,
the anode region is of the first type of conductivity, and
the cathode region is of the second type of conductivity.

4. The method according to claim 1, further comprising:
depositing a dielectric layer at least partially overlying each of the cathode region, the anode region, the insulating layer, and the gate region;
forming a plurality of vias through the dielectric layer; and
forming a plurality of terminals in the plurality of vias, the plurality of terminals including a cathode terminal, an anode terminal, a gate terminal, and a source terminal.

5. The method according to claim 4, further comprising at least two vias overlying the gate region and forming the gate terminal through the at least two vias overlying the gate region.

6. The method according to claim 1 wherein the forming of the gate region includes forming a gate structure extending into the semiconductor substrate from the first surface through the body region, the forming of the gate structure includes:
forming a trench extending into the semiconductor substrate from the first surface through the body region;
forming the insulating layer on the first surface and on surfaces of the trench;
forming the un-doped conductive layer on the insulating layer; and
forming the doped conductive layer on the un-doped conductive layer.

7. The method according to claim 1 wherein the un-doped conductive layer includes un-doped polysilicon, and the doped conductive layer includes doped polysilicon.

8. The method according to claim 1 wherein the forming of the gate region and the anode region includes performing a first ion implantation of dopants of a first type of conductivity into the second conductive region and the first portion of the first conductive region, respectively; and
forming the body region and the cathode region includes performing a second ion implantation of dopants of a second type of conductivity into the semiconductor substrate and the second portion of the first conductive region, respectively.

9. The method of claim 1, wherein forming the anode region includes doping the first portion of the first conductive region to have the same type of conductivity as the gate region, the doping of the second conductive region and the doping of the first portion of the first conductive region being performed at the same time.

10. The method of claim 1 wherein forming the body region includes doping the semiconductor substrate to have a different type of conductivity from the doped conductive layer, and forming the cathode region includes doping the second portion of the first conductive region to have the same type of conductivity as the body region, the doping of the semiconductor substrate and the doping of the second portion of the first conductive region being performed at the same time.

11. A method, comprising:
forming a trench in a surface of a substrate, the substrate including a source region on a body region;

forming an insulating layer on the surface of the substrate and in the trench;

forming a first conductive layer on the surface of the substrate and in the trench, the insulating layer separating the first conductive layer from the substrate;

forming a second conductive layer in the trench, the first conductive layer separating the second conductive layer from the insulating layer;

separating the first conductive layer in to a first conductive region and a second conductive region by removing a portion of the first conductive layer that is on the surface of the substrate, the first conductive region being on the surface of the substrate, the second conductive region being on the surface of the substrate and in the trench;

forming a gate region from the second conductive layer and the second conductive region, the forming of the gate region including applying an ion implantation process to the second conductive region; and forming a thermal diode from the first conductive region, forming the thermal diode including:
 forming an anode from a first portion of the first conductive region; and
 forming a cathode from a second portion of the first conductive region.

12. The method according to claim 11, wherein
the substrate is of a first type of conductivity,
the body region is of a second type of conductivity,
the source region is of the first type of conductivity,
the anode is of the first type of conductivity, and
the cathode is of the second type of conductivity.

13. The method of claim 11, further comprising forming a dielectric layer on the first conductive layer, the second conductive layer, and the thermal diode, the anode being separated from the second conductive region by a portion of the dielectric layer, the portion of the dielectric layer being in contact with the anode, the second conductive region, and the insulating layer.

14. The method of claim 11, further comprising performing a first implantation process doping the second conductive region and the first portion of the first conductive region to have a first type of conductivity.

15. The method of claim 14, further comprising performing a second implantation process doping a portion of the substrate and the second portion of the first conductive region to have a second type of conductivity.

16. A method, comprising:
forming a transistor in a substrate adjacent to a thermal diode on a surface of the substrate, the forming including:
 forming a trench through the surface of the substrate;
 forming a first conductive layer in the trench and on the surface of the substrate;
 forming a second conductive layer in the trench and on the first conductive layer, the first conductive layer separating the second conductive layer from the substrate;
 separating a first portion of the first conductive layer from a second portion of the first conductive layer by removing a portion of the first conductive layer that is on the surface of the substrate, the first portion being in the trench and on the surface of the substrate, the second portion being on the surface of the substrate;
 forming a gate region from the second conductive layer and the first portion of the first conductive layer, the forming of the gate region including doping the first portion of the first conductive layer subsequent to separating the first portion of the first conductive layer from the second portion of the first conductive layer;
 forming an anode of the thermal diode from the second portion of the first conductive layer; and
 forming a cathode of the thermal diode from the second portion of the first conductive layer.

17. The method of claim 16 wherein the forming of the anode includes forming the anode between the gate region and the cathode.

18. The method of claim 16, further comprising:
forming a body region in the substrate, the trench extending into the body region;
forming a source region on the body region in the substrate, the trench extending into the source region, the anode and cathode being formed on the source region.

19. The method of claim 16 wherein the first conductive layer is an un-doped polysilicon layer and the second conductive layer is a doped polysilicon layer.

20. The method of claim 16, further comprising forming a body region in the substrate by doping a portion of the substrate to have a first type of conductivity, the forming of the cathode of the thermal diode including doping, at the same time as the doping of the portion of the substrate, the second portion of the first conductive layer to have the first type of conductivity.

* * * * *